United States Patent [19]

Bracht et al.

[11] Patent Number: 4,594,717

[45] Date of Patent: Jun. 10, 1986

[54] DRIVER CIRCUIT FOR LASER DIODE

[75] Inventors: Roger R. Bracht, Colorado Springs; Dorrel R. Silvey, Elbert, both of Colo.

[73] Assignee: Optical Storage International-U.S., Minneapolis, Minn.

[21] Appl. No.: 593,779

[22] Filed: Mar. 27, 1984

[51] Int. Cl.⁴ ............................................... H01S 3/10
[52] U.S. Cl. ......................................... 372/38; 372/26; 455/609
[58] Field of Search ................ 372/38, 26, 29, 25; 307/311, 296 R, 296 A, 270; 455/609, 611

[56] References Cited

U.S. PATENT DOCUMENTS

| | | | |
|---|---|---|---|
| 4,027,179 | 5/1977 | Kawamoto et al. | 372/38 |
| 4,243,951 | 1/1981 | Wolkstein et al. | 372/38 |
| 4,295,226 | 10/1981 | Dombrowski | 455/611 |
| 4,400,812 | 8/1983 | Clark et al. | 372/38 |
| 4,412,331 | 10/1983 | Chapman | 372/38 |

Primary Examiner—James W. Davie
Attorney, Agent, or Firm—J. A. Genovese; F. W. Niebuhr

[57] ABSTRACT

A circuit is shown for rapidly enabling and disabling a high current laser diode through a coaxial cable responsive to a data signal received at the circuit input. At the circuit input are two switching transistors, one or the other of which is forward biased while its counterpart is reverse biased, depending upon the level of the incoming data signal. The output of one of the switching transistors is fed to the base inputs of two emitter follower transistors, one PNP and the other NPN. The emitter terminals of the follower transistors are connected to the gate terminal of an enhancement mode VMOS field effect transistor. When the VMOS FET is enabled, current flows in the laser diode to energize it. The voltage level at the input to the follower transistors determines the voltage to the gate input of the FET. When the incoming data signal is low, the gate-to-source potential difference is near zero, thus preventing the FET from conducting current. A change to the high level for incoming data rapidly increases the gate-to-source voltage to enable the FET and activate the laser.

11 Claims, 1 Drawing Figure

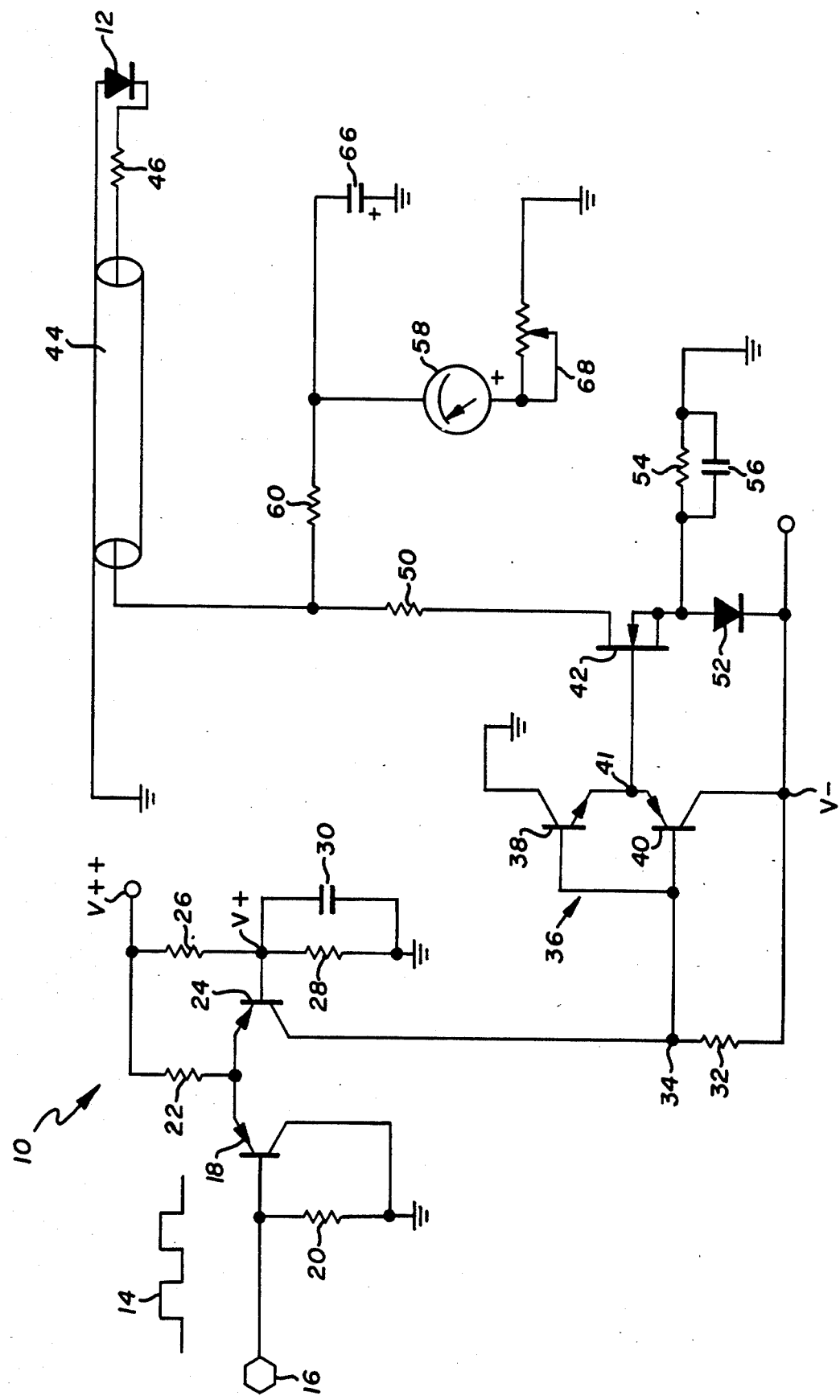

DRIVER CIRCUIT FOR LASER DIODE

BACKGROUND OF THE INVENTION

This invention relates to driver circuits for controlling the response of a diode laser to digital input signals.

Optical recording involves the use of a ight source such as a laser diode to "write" information on an optical disk, usually by locally altering the disk surface to form a spot or hole which subsequently can be sensed by a reduced power laser in "reading" the information placed on the disk. As is the case with magnetic recording and other information processing techniques, the ever-present goal in optical recording is to increase the speed at which data can be written and read. A significant challenge encountered in optical data storage is the need for an effective means to force a laser diode to rapidly respond to incoming digital data.

One approach to this problem is shown in U.S. Pat. No. 4,027,179 to Kawamoto et al. granted May 31, 1977. A carrier-injected avalanche device 10 causes an injection laser 22 to emit light responsive to signals from a pulse generator 28. An offset voltage is provided by a capacitor 37 through a resistor 32, to rapidly deplete any electric field caused by accumulation of electrons and holes at a control junction 19 between semiconductor layers 14 and 12 of the avalanche device. This enables a higher pulse repetition rate in the injection laser. In U.S. Pat. No. 4,295,226 to Dombrowski granted Oct. 13, 1981, the junction depletion layer of a light emitting diode 13 is depleted when a transistor 16 is enabled, thus to provide a positive current overdrive to the LED.

The Dombrowski patent further teaches a non-zero "off" state for current to the LED. Reduction of the current to zero then provides a negative overdrive effect without actually reverse biasing the diode. Pre-biasing of a field effect transistor is shown in U.S. Pat. No. 4,243,951 to Wolkstein et al. granted Jan. 6, 1981. The pre-biasing produces a current in FET 17 just below the "lasing" level of a laser diode 26. Such pre-biasing reduces the time for diode 26 to respond to the high-going pulse of a digital signal 12.

It is an object of the present invention to provide a simple, low-cost means for rapidly activating and deactivating a laser diode in response to a digital signal. It is a further object of the invention to achieve such response in a laser diode through a coaxial cable with a minimum loss of speed even at high current requirements with minimum impact on adjacent circuitry. Yet another object of the invention is to produce rapid response in a laser diode without prebiasing it and without a separate circuit for depleting a junction between semiconductor layers.

SUMMARY OF THE INVENTION

To achieve these and other objects, there is provided a driver circuit for controlling a laser diode in response to a digital input signal having high and low voltage levels. The circuit includes a switching means for receiving a digital input signal and generating a switching means output comprising a first switching voltage level in response to said high level and a second switching voltage level in response to said low level.

The driver circuit further includes an emitter follower means having as its input the output of the switching means, and generating an emitter follower output comprising a first follower output voltage level in response to said first switching voltage level and a second follower output voltage level in response to said second switching voltage. The emitter follower output is connected to the gate of a VMOS field effect transistor, and the source terminal of the FET is biased to a preselected source voltage. The FET is enabled to conduct current whenever the gate voltage is at a first level substantially greater than the source voltage, and disabled whenever the gate voltage is not substantially greater then the source voltage. One of the follower output voltage levels is substantially greater than the source voltage, while the other is not. A laser diode is connected in series with the FET.

Preferably the switching means includes first and second switching transistors. The base input to the first transistor is the digital input signal, while the base input to the second transistor is a pre-selected voltage between the high and low levels of the digital signal. The voltage level at the emitters of the switching transistors is such that the first switching transistor is forward biased when the digital signal is low and reverse biased when the digital signal is high, and the second switching transistor is forward biased whenever the digital input signal is high and reverse biased when the digital input is low. The collector terminal of the second switching transistor is the switching means output.

The emitter follower means can include first and second follower transistors connected in series between first and second reference voltage levels. The switching means output is then connected to the base inputs of the follower transistors. These constant voltage levels are chosen such that the first switching voltage level forward biases the first follower transistor and reverse biases the second follower transistor, while the second switching voltage level forward biases the second follower transistor and reverse biases the first follower transistor.

The first follower transistor preferably is an NPN transistor having its collector connected to the first constant voltage level source, with the second follower transistor being a PNP transistor with its collector terminal connected to the second constant voltage level source. The emitter terminals of the emitter follower transistors together form the emitter follower means output.

The emitter follower transistors, in response to the signal from the switching means, positively drive the field effect transistor in both the "on" and "off" directions. The hard drive in both directions eliminates the need for pre-biasing of the laser diode since the enhancement mode field effect transistor rapidly responds to the hard drive to cause the diode to emit light rapidly in response to the high-going signal, and to quickly cease emitting in response to the low-going digital signal. The driver circuit can rapidly drive the laser diode through a relatively long coaxial cable and remain cool even under high current conditions.

IN THE DRAWINGS

The single drawing FIGURE is a schematic of the preferred embodiment of a laser diode control circuit in accordance with the preferred embodiment of the present invention.

DETAIL DESCRIPTION OF THE PREFERRED EMBODIMENT

Referring now to the drawing, there is shown a driver circuit 10 for controlling the operation of a laser diode 12 in response to an incoming digital data signal 14. Signal 14 typically is a digital input signal compatible with transistor-transistor logic (TTL) having a "high" level of five volts and a "low" value of zero volts or ground potential.

Signal 14 is received at an input node 16 of circuit 10 and applied to the base terminal of a PNP switching transistor 18. The collector terminal of switching transistor 18 is connected to ground. The incoming signal also is terminated to ground through a resistor 20. This resistor also maintains the base input at a low level if there is no digital input. The required first stage switching current is supplied from a positive voltage source V++ through a resistor 22 to the emitter terminals of first switching transistor 18 and a second switching transistor 24, also a PNP transistor. The positive voltage V++ also is connected to ground through first and second voltage setting resistors 26 and 28 in series between the voltage source and ground. Between resistors 26 and 28 is a connection to the base terminal of second switching transistor 24. Resistors 26 and 28 are selected such that an intermediate reference level of positive voltage, V+, is continually applied to the base of second switching transistor 24. A capacitor 30 is connected between the transistor base and ground, in parallel with resistor 28, thus to minimize the effect of AC signal components at the base of transistor 24.

First and second transistors 18 and 24, in cooperation with resistors 20, 22, 26, and 28, comprise a switching means in which one or the other of the transistors conducts current, depending upon the level of the incoming signal 14. Specifically, in response to the low signal of zero volts in signal 14, transistor 18 is forward biased and the majority of current due to voltage source V++ is conducted through resistor 22 and transistor 18 to ground. As a result, a low positive voltage is produced at the emitter terminals of transistors 18 and 24, maintaining transistor 18 in a forward biased condition but reverse biasing transistor 24 since the emitter voltage is less than voltage V+. It follows that, since most of the current is conducted through resistor 22 and transistor 18 to ground, there is negligible current through transistor 24 and the voltage resulting at the collector of transistor 24 will be nearly equal to the level at a negative voltage source V−.

Should the high level of signal 14 be received at node 16, the increased voltage level immediately reverse biases first switching transistor 18 so that it ceases to conduct current. The voltage level at the emitter inputs to transistors 18 and 24 consequently is forced upward and, as the base input to transistor 24 is at the V+ level which is lower than the high level, it is this transistor which now becomes forward biased, thus to conduct the majority of current generated due to voltage source V++ through itself, resistor 22 and a resistor 32 to negative voltage source V−.

Between transistor 24 and resistor 32 is a node 34 which serves as the input to a dual emitter follower 36 including a first follower transistor 38 and a second follower transistor 40 in series between two reference voltage levels: ground and negative voltage V−. Transistor 38 is an NPN transistor having its collector terminal connected to ground, while transistor 40, a PNP transistor, has its collector terminal connected to the negative voltage source. The signal at node 34 is an input to base terminals of both transistors 38 and 40. As later explained, the level of the signal at node 34 determines which of transistors 38 and 40 is conductive, and the level at the node is itself responsive to whether or not second switching transistor 24 is conducting current. Transistors 38 and 40 provide sufficient drive to isolate the VMOS gate capacitance from the high speed switching current.

Linked to the emitter terminals of follower transistors 38 and 40 is a node 41 which also is the gate input to an enhancement mode VMOS FET (very high current metal oxide semiconductor field effect transistor) 42. FET 42 is connected in series with laser diode 12 as follows: diode 12 is connected to ground through a coaxial cable 44. A resistor 46 provides a matching impedance. Resistor 50 provides a selected resistance for setting the maximum current to be switched through laser diode 12. The source terminal of FET 42 is connected to negative voltage V− through a diode 52, and further is connected to ground through a resistor 54 and capacitor 56 connected in parallel which act as a current sink to reduce the effect of current surges. Being of enhancement mode type, FET 42 is enabled whenever the gate to source voltage is positive and is non-conductive whenever the gate to source potential difference is at or near zero.

Driver circuit 10 operates as follows: When incoming signal 14 is at its low level, first switching transistor 18 conducts while a second switching transistor 24 is reverse biased and therefore non-conductive. Consequently, the voltage level at node 34, which is the input to emitter follower 36, is approximately at low voltage level V−. This reverse biases the first follower transistor 38 to prevent flow of current through it. Concurrently, the low level at node 34 forward biases second follower transistor 40 to conduct current through transistor 40 should the voltage level at node 41 be higher than V−. As the connection to V− through diode 52 maintains the voltage at the source of FET 42 at or near V−, FET 42 is non-conductive.

When the level of input signal 14 goes high, first switching transistor 18 is reverse biased, and second transistor 24 becomes conductive as previously explained. In response to conduction from voltage source V++, the voltage at node 34 is instantaneously forced upward to a significantly higher voltage level than V−. The increased voltage at node 34 immediately forward biases first follower transistor 38 and reverse biases second follower transistor 40, and the newly opened conductive path through transistor 38 rapidly brings the voltage level at node 41, the gate of FET 42, upward from its prior level, approximately V−.

A characteristic of enhancement mode VMOS FET 42 is a low capacitance between the gate and drain terminals, and a high capacitance between its gate and source terminals. It is the rapid increase in gate voltage, brought about by transistor 38 connected to ground, which enables a sufficiently rapid voltage increase to turn on FET 42 "hard", thus to enable current through FET 42 and laser diode 12 causing it to emit light in accordance with the rise to the higher level in input signal 14.

In response to signal 14 going low, driver circuit 10 rapidly deactivates laser diode 12. As the incoming signal returns to its low level, first switching transistor 18 becomes forward biased, thus to draw most of the current generated at voltage source V++ through it to ground. This reduces the voltage at the emitter terminal of switching transistor 24, thus to reverse bias it and cut off the current from voltage V++ to negative voltage V−. In the absence of current through transistor 24, negative voltage source V− rapidly pulls voltage at input node 34 downward toward V−, thus to reverse bias and disable first follower transistor 38 while forward biasing second follower transistor 40. The forward biasing of transistor 40, in closing the circuit between node 41 and negative voltage source V−, rapidly reduces the voltage at the FET gate to approximately V−, thus to turn off FET 42 "hard".

Resistor 54 and capacitor 56, connected in parallel between the source terminal of FET 42 and ground, tend to filter AC components and prevent surge currents from propogating to other adjacent circuitry. Circuitry for monitoring the read level current applied through diode 12 includes a meter 58 connected to the laser circuit through a resistor 60. This circuitry may or may not be used as required by the application. A potentiometer 68 connects meter 58 to ground and is adjustable to accommodate the laser current and meter reading level. A capacitor 66 is connected to ground in parallel with the meter and potentiometer and acts as a filter.

In the preferred embodiment compatible with transistor/transistor logic (TTL), the following values for components have been found satisfactory:
Resistor 20: 56 ohms
Resistor 22: 82 ohms
Resistor 26: 330 ohms
Resistor 28: 220 ohms
Capacitor 30: 0.1 microfarad
In specific applications, resistor 20 may be other than 56 ohms, as it is selected to match the impedance of the incoming signal source. The voltage source V++ is preferably at a +5 volts, while the negative voltage source V− is at −24 volts. This voltage source should be variable to allow write power adjustment. Resistor 32 between the voltage sources is preferably 470 ohms.

The resistor 50 in the laser diode circuit is 22 ohms. Resistor 46 is at 47 ohms and with the diode laser resistance of approximately 3 ohms, balances the coaxial cable resistance of 50 ohms. The filtering capacitor 56 connected to the source terminal of FET 42 is one microfarad while the resistor 54 is 1K ohms. Resistor 60 in the read circuit is 220 ohms; potentiometer 66 is approximately 1K ohms, while capacitor 66 is 10 microfarads.

The components of circuit 10, particularly the switching means, can readily be adjusted for compatibility with emitter coupled logic. For signal 14, ECL values are a high level signal of −0.8 volts and the low level signal of −1.8 volts. Also, the incoming signal is terminated through resistor 20 to −2 volts rather than to ground. The values for the switching means components will then be as follows:
V++ biased to −1.2 volts
Resistor 20: 100 ohms
Resistor 22: 200 ohms Thus is disclosed a driver circuit for rapidly and positively controlling current through a laser diode in response to an input digital data signal. The hard drive characteristic of the emitter follower means, both in enabling and disabling the VMOS FET, eliminates the need for maintaining a low "steady state" current in the diode laser, thus to increase its life and eliminate the problem of distinguishing between low level and high level light emission from the diode laser.

In addition, the circuit allows high currents to be very rapidly switched through an interconnecting coaxial cable to control a laser diode. The circuitry remains relatively cool and minimizes current surges that could otherwise adversely affect associated circuitry.

What is claimed is:

1. A driver circuit for controlling a laser diode in response to a digital input signal, said driver circuit including:
a switching means for receiving a digital input signal, said digital signal having a high voltage level and a low voltage level, said switching means generating a switching means output comprising a first switching voltage level in response to said high level and a second switching voltage level responsive to said low level; an emitter follower means having as its input said switching means output and generating an emitter follower output comprising a first follower output voltage level in response to said first switching voltage level and a second follower output voltage level in response to said second switching voltage level; a VMOS field effect transistor having a gate connected to said emitter follower means whereby the voltage level at said gate is substantially equal to the voltage level of said emitter follower output, and having a source biased to a pre-selected source voltage, said field effect transistor enabled whenever the voltage level at said gate is substantially greater than said source voltage, and disabled when the voltage level at said gate is not substantially greater than said source voltage, one of said first and second follower output voltage levels being substantially greater than said source voltage and the other of said follower output voltage levels being no greater than a voltage level near said source voltage; and a laser diode connected in series with said field effect transistor and emitting light whenever said field effect transistor is enabled.

2. The driver circuit of claim 1 wherein: said first follower output voltage level is substantially greater than said source voltage.

3. The driver circuit of claim 1 wherein: said switching means includes first and second switching transistors, said first transistor receiving at its base said digital input signal, said second switching transistor receiving at its base a preselected voltage between said high and low voltage levels of said digital input signal, and wherein the voltage level at the emitters of said switching transistors is such that: said first switching transistor is forward biased whenever said digital input signal is low and reverse biased whenever said digital input signal is high; and said second switching transistor is forward biased whenever said digital input signal is high and reversed biased whenever said digital input signal is low; and wherein the voltage level at the collector of said second switching transistor is said switching means output.

4. The drive circuit of claim 3 including: a means for providing the voltage level at the emitters of said switching transistors including a switching voltage source connected, through a resistor, to said emitters.

5. The driver circuit of claim 4 wherein: the voltage level at said switching voltage source is substantially equal to said high voltage level.

6. The driver circuit of claim 5 wherein: both of said switching transistors are PNP transistors.

7. The driver circuit of claim 3 wherein: said emitter follower means includes a first follower transistor and a second follower transistor connected in series between first and second reference voltage levels; wherein the input to the bases of said follower transistors is said switching means output; and wherein said reference voltage levels are selected such that said first switching voltage level forward biases said first follower transistor and reverse biases said second follower transistor; and said second switching voltage level reverse biases said first follower transistor and forward biases said second follower transistor.

8. The driver circuit of claim 7 wherein: said first follower transistor is an NPN transistor with its collector maintained at said first reference voltage level, and said second follower transistor is a PNP transistor with its collector maintained at said second reference voltage level, and wherein the voltage level at the emitters of said follower transistors comprises said emitter follower output.

9. The driver circuit of claim 1 wherein: said emitter follower means includes a first follower transistor and a second follower transistor connected in series between first and second reference voltage levels; wherein the input to the bases of said follower transistors is said switching means output; and wherein said reference voltage levels are selected such that said first switching voltage level forward biases said first follower transistor and reverse biases said second follower transistor; and said second switching voltage level reverse biases said first follower transistor and foward biases said second follower transistor.

10. The driver circuit of claim 9 wherein: said first follower transistor is a NPN transistor with its collector maintained at said first reference voltage level, and said second follower transistor is a PNP transistor with its collector maintained at said second reference voltage level, and wherein the voltage level at the emitters of said follower transistors comprises said emitter follower output.

11. A method for controlling the emission of light by a laser diode in response to a digital input signal, said method including the steps of:

receiving a digital input signal having a high voltage level and a low voltage level, and generating a first switching voltage level in response to said high level and a second switching voltage level responsive to said low level;

generating an emitter follower means output comprising a first follower output voltage level in response to said first switching voltage level in response to said first switching voltage level and a second follower output voltage level in response to said second switching voltage level, one of said first and second follower output voltage levels being substantially greater than a preselected source voltage and the other of said follower output voltage levels being no greater than a level near said source voltage;

receiving said emitter follower means output at the gate of a VMOS field effect transistor and maintaining the source of said field effect transistor as said preselected source voltage, thereby to enable said field effect transistor whenever said gate voltage level is substantially greater than said source voltage, and to disable said field effect transistor when the gate voltage is not substantially greater than said source voltage; and connecting a laser diode in series with said field effect transistor.

* * * * *